United States Patent
Hudson et al.

(10) Patent No.: US 7,436,182 B1
(45) Date of Patent: Oct. 14, 2008

(54) CRYOGENIC NMR PROBE CAPACITORS WITH DIELECTRIC HEAT SINKS

(75) Inventors: Alexander M. J. Hudson, Palo Alto, CA (US); Sean Burns, East Palo Alto, CA (US); Knut Mehr, San Francisco, CA (US)

(73) Assignee: Varian, Inc., Palo Alto, CA (US)

(*) Notice: Subject to any disclaimer, the term of this patent is extended or adjusted under 35 U.S.C. 154(b) by 0 days.

(21) Appl. No.: 11/903,350

(22) Filed: Sep. 21, 2007

(51) Int. Cl.
*G01V 3/00* (2006.01)

(52) U.S. Cl. ...................... 324/322; 324/318

(58) Field of Classification Search ............... 324/322, 324/318
See application file for complete search history.

(56) References Cited

U.S. PATENT DOCUMENTS

| | | | |
|---|---|---|---|
| 3,480,846 A * | 11/1969 | Mathes | 361/276 |
| 4,903,094 A | 2/1990 | Plus et al. | |
| 5,047,893 A * | 9/1991 | Farrall et al. | 361/674 |
| 5,757,243 A | 5/1998 | Mizuno et al. | |
| 5,814,992 A * | 9/1998 | Busse-Grawitz et al. | 324/318 |
| 5,854,604 A * | 12/1998 | Przybysz et al. | 342/175 |
| 6,548,338 B2 * | 4/2003 | Bernstein et al. | 438/210 |
| 6,617,851 B1 * | 9/2003 | Bergmann | 324/318 |
| 6,838,880 B2 * | 1/2005 | Hofmann et al. | 324/318 |
| 6,937,117 B2 | 8/2005 | Terashima et al. | |

* cited by examiner

*Primary Examiner*—Louis M Arana
(74) *Attorney, Agent, or Firm*—Bella Fishman; Andrei D. Popovici

(57) ABSTRACT

According to some embodiments, low-temperature (cryogenic) nuclear magnetic resonance (NMR) probe fixed capacitors include thermally-conductive dielectric layers serving to thermally connect the capacitors to a cryogenic heat sink. For example, a sapphire layer may be metalized on opposite sides to form copper capacitor plates, and along an edge to form a copper heat sink contact. Heat generated by RF currents during an operation of an NMR circuit including such a capacitor is discharged through the thermally-conductive dielectric to the heat sink. Cooling cold-probe circuit components such as capacitors through thermally-conductive capacitor dielectrics allows reducing perturbations introduced into the circuit by components such as heat sinks.

17 Claims, 3 Drawing Sheets

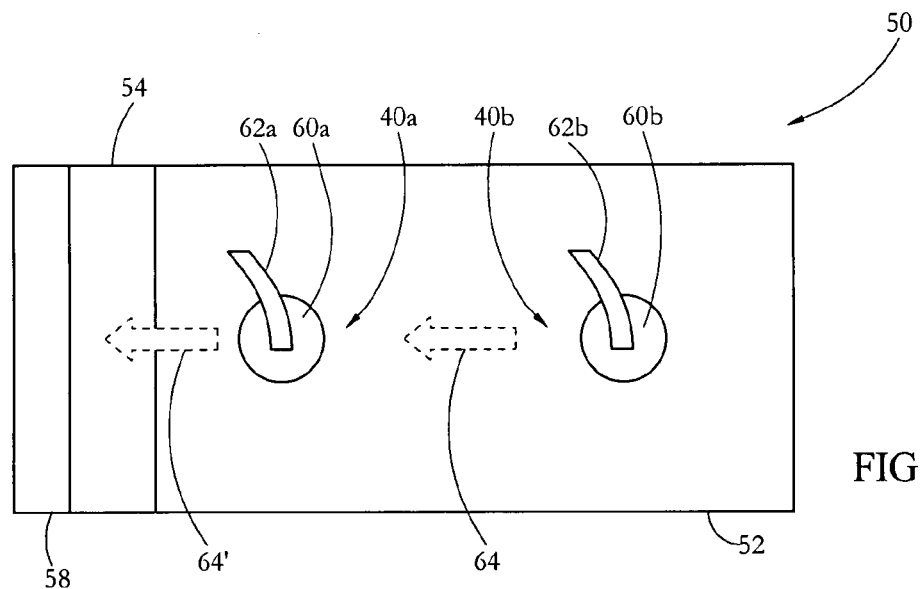
FIG. 3-A
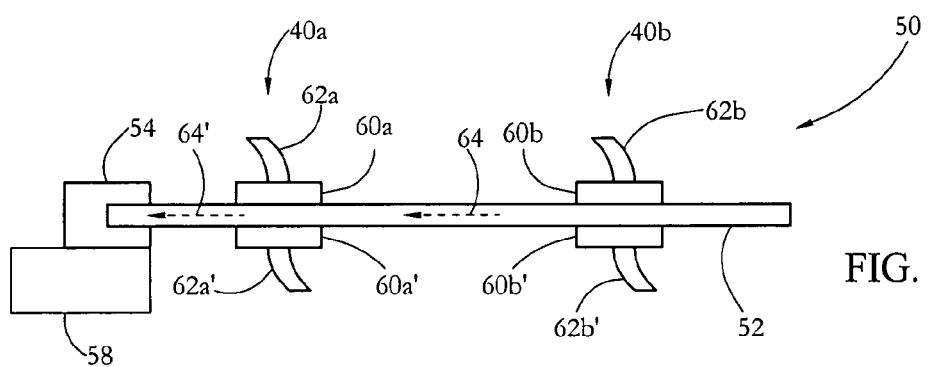
FIG. 3-B

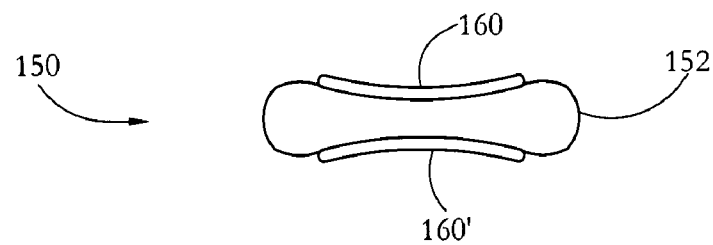
FIG. 4-A
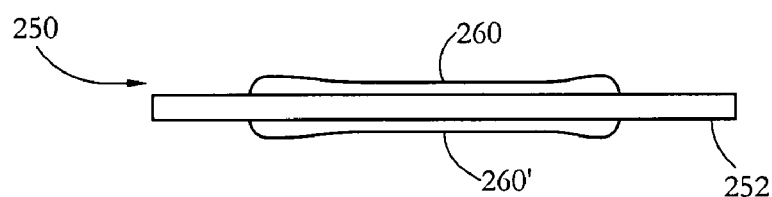
FIG. 4-B
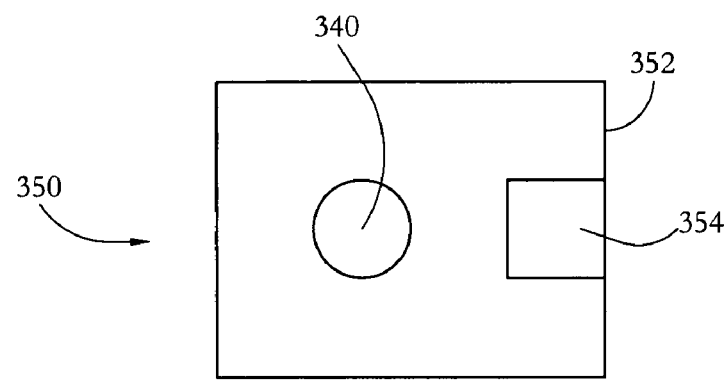
FIG. 5-A
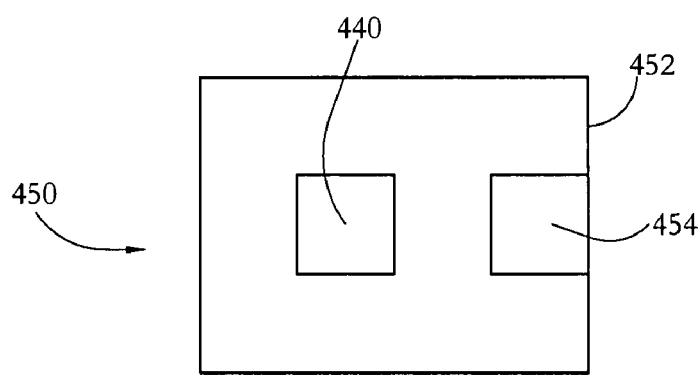
FIG. 5-B

CRYOGENIC NMR PROBE CAPACITORS WITH DIELECTRIC HEAT SINKS

FIELD OF THE INVENTION

This invention relates to magnetic resonance system and methods, and in particular to capacitor systems and methods for cryogenic NMR probes.

BACKGROUND OF THE INVENTION

Nuclear magnetic resonance (NMR) spectrometers typically include a superconducting magnet for generating a static magnetic field $B_0$, and an NMR probe including one or more special-purpose radio-frequency (RF) coils for generating a time-varying magnetic field $B_1$ perpendicular to the field $B_0$, and for detecting the response of a sample to the applied magnetic fields. Each RF coil and associated circuitry can resonate at the Larmor frequency of a nucleus of interest present in the sample. The RF coils are typically provided as part of an NMR probe, and are used to analyze samples situated in sample tubes or flow cells.

An NMR frequency of interest is determined by the nucleus of interest and the strength of the applied static magnetic field $B_0$. In order to maximize the sensitivity of NMR measurements, the resonant frequency of the excitation/detection circuitry is set to be equal to the frequency of interest. The resonant frequency of the excitation/detection circuitry varies as $$v = 1/2\pi\sqrt{LV} \qquad [1]$$

where L and C are the effective inductance and capacitance, respectively, of the excitation/detection circuitry. Additionally, in order to maximize the transfer of RF energy into the RF coils, the impedance of each coil is matched to the impedance of the transmission line with a network of components electrically connected to the RF coil. If the coil is not impedance-matched, a sub-optimal fraction of the RF energy sent to the coil actually enters the coil. The rest of the energy is reflected, and does not contribute to the NMR measurement. Variable and fixed capacitors as well as inductors may be used to set the NMR circuit resonant frequency to desired values and to ensure optimal impedance matching.

Some NMR systems employ a cryogenically-cooled NMR probe. A cryogenic fluid such as liquid nitrogen or liquid/gaseous helium conductively cools NMR probe components such the NMR RF coils, circuits and preamplifiers. The sample of interest may be held at room temperature or at a different temperature than the cryogenically-cooled circuit components. Low-temperature probes commonly allow a reduction in the coil electrical resistance, and achieve relatively high Q-values. At the same time, as the coil thermal noise is reduced, other noise contributions may become increasingly significant.

SUMMARY OF THE INVENTION

According to one aspect, a low-temperature nuclear magnetic resonance probe includes a cryogenically-cooled radio-frequency nuclear magnetic resonance coil, and a cryogenically-cooled fixed capacitor electrically-connected to the radio-frequency coil. The capacitor includes a pair of fixed opposing electrically-conductive plates, and a thermally-conductive dielectric layer situated between the conductive plates and thermally coupled to a cryogenic heat sink through a contact area distinct from the conductive plates, for cooling the conductive plates through the dielectric layer.

According to another aspect, a method includes cryogenically cooling a pair of opposing conductors of a fixed capacitor through a thermally-conductive capacitor dielectric disposed between the opposing conductors, the capacitor dielectric being connected to a cryogenic heat sink; and performing a nuclear magnetic resonance measurement using a cryogenically-cooled nuclear magnetic resonance radio-frequency coil electrically connected to the fixed capacitor.

According to another aspect, a low-temperature nuclear magnetic resonance apparatus includes a cryogenically-cooled fixed lumped-element capacitor and a nuclear magnetic resonance radio-frequency coil electrically connected to the capacitor. The capacitor includes a sapphire dielectric, a pair of metallic capacitor plates attached to opposite sides of the sapphire dielectric, and a metallic heat sink contact attached to the sapphire dielectric, for establishing a thermal connection between the capacitor plates and a cryogenic heat sink through the sapphire dielectric to cool the capacitor plates.

BRIEF DESCRIPTION OF THE DRAWINGS

The foregoing aspects and advantages of the present invention will become better understood upon reading the following detailed description and upon reference to the drawings where:

FIG. 3-A shows a top (in-plane) view of a fixed capacitor assembly including two capacitors sharing a common thermally-conductive dielectric layer serving as a thermal ground, according to some embodiments of the present invention.

FIG. 3-B shows a side view of the capacitor assembly of FIG. 3-A, according to some embodiments of the present invention.

FIG. 4-A shows a fixed capacitor having concave opposing plates attached to opposite surfaces of a concavely-curved dielectric layer, according to some embodiments of the present invention.

FIG. 4-B shows a fixed capacitor having rounded-edge, generally-planar opposing plates attached to opposite surfaces of a planar dielectric layer, according to some embodiments of the present invention.

FIG. 5-A shows a capacitor assembly including a single round capacitor, according to some embodiments of the present invention.

FIG. 5-B shows a capacitor assembly including a square capacitor, according to some embodiments of the present invention.

BRIEF DESCRIPTION OF THE INVENTION

The following description illustrates the present invention by way of example and not necessarily by way of limitation. Any reference to an element is understood to refer to at least one element. A set of elements is understood to include one or more elements. A plurality of elements includes at least two elements. Each recited element or structure can be formed by or be part of a monolithic structure, or be formed from multiple distinct structures. Any recited electrical or mechanical connections can be direct connections or indirect operative connections established through intermediary circuit elements or structures. For example, a radio-frequency NMR coil may be connected to a capacitor through a number of circuit components. Unless otherwise specified, a plate or layer may be planar or quasi-planar, for example concavely- or convexly-curved. Unless otherwise specified, a heat sink may be any structure which serves to withdraw heat from a heat source; such a structure may include a solid block of metal or other material, a heat exchanger, or a cryogenic fluid conduit, among others.

The following description illustrates embodiments of the invention by way of example and not necessarily by way of limitation.

Figure 1:
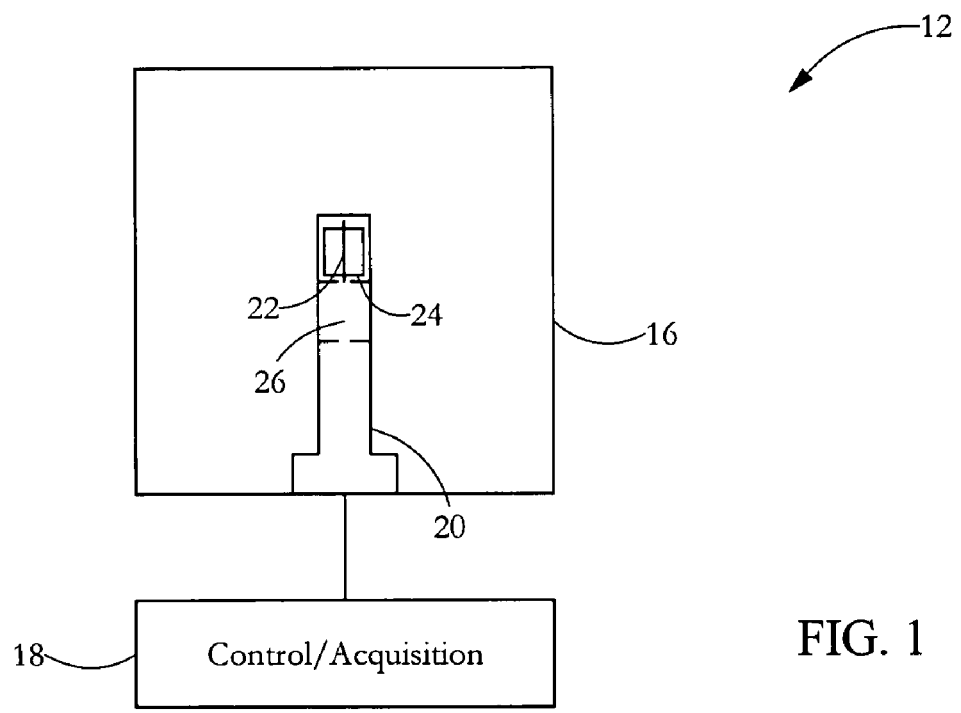
FIG. 1 is a schematic diagram of an exemplary NMR spectrometer according to some embodiments of the present invention.

FIG. 1 is a schematic diagram illustrating an exemplary nuclear magnetic resonance (NMR) spectrometer 12 according to an embodiment of the present invention. Spectrometer 12 comprises a magnet 16, an NMR probe 20 inserted in a cylindrical bore of magnet 16, and a control/acquisition system 18 electrically connected to magnet 16 and probe 20. Probe 20 includes one or more radio-frequency (RF) coils 24 and associated electrical circuit components. For simplicity, the following discussion will focus on a single coil 24, although it is understood that a system may include other similar coils. A sample container 22 is positioned within probe 20, for holding an NMR sample of interest within coil 24 while measurements are performed on the sample. Sample container 22 may be a sample tube or a flow cell. A number of electrical circuit components such as capacitors, inductors, and other components are situated in a circuit region 26 of probe 20, and are connected to coil 24. Coil 24 and the various components connected to coil 24 form one or more NMR measurement circuits. Circuit region 26 is situated adjacent to coil 24, immediately underneath coil 24.

To perform a measurement, a sample is inserted into a measurement space defined within coil 24. Magnet 16 applies a static magnetic field $B_0$ to the sample held within sample container 22. Control/acquisition system 18 comprises electronic components configured to apply desired radio-frequency pulses to probe 20, and to acquire data indicative of the nuclear magnetic resonance properties of the samples within probe 20. Coil 24 is used to apply radio-frequency magnetic fields $B_1$ to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field. A single coil may be used to perform measurements at multiple frequencies, by tuning the resonant frequency of the NMR measurement circuit that includes the coil. Tuning the circuit resonant frequency may be achieved by adjusting the capacitance values of one or more variable capacitors included in the circuit.

Figure 2:
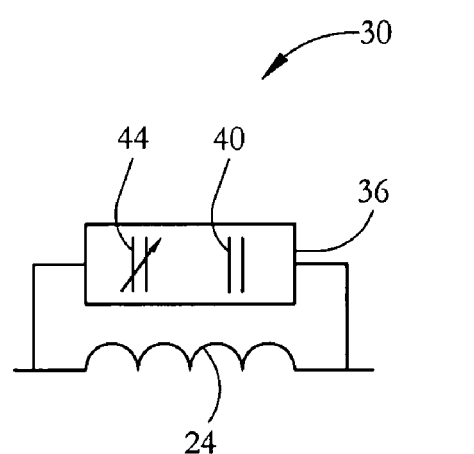
FIG. 2 is a schematic diagram of an NMR LC circuit including variable and fixed capacitors, according to some embodiments of the present invention.

FIG. 2 shows a schematic diagram of a tunable NMR measurement circuit 30 according to some embodiments of the present invention. Measurement circuit 30 includes NMR sample coil 24, and a circuit 36 including fixed capacitors 40 and variable capacitors 44 connected to sample coil 24. Measurement circuit 30 may also include other active and/or passive components.

FIGS. 3-A-B show top (in-plane) and side views, respectively, of a fixed capacitor assembly 50 including two fixed capacitors 40a-b, according to some embodiments of the present invention. Capacitors 40a-b are fixed lumped-element capacitors, and have an overall size smaller than the wavelength of the RF current of interest. Capacitors 40a-b share a common thermally-conductive planar dielectric layer 52 serving as a thermal ground. A heat sink contact 54 is situated along a thermal-anchoring edge of dielectric layer 52. Heat sink contact 54 establishes a thermal connection between dielectric layer 52 and a heat sink 58. The direction of heat flow through dielectric layer 52 is schematically illustrated by the arrows 64, 64'.

Capacitor 40a includes two planar, disk-shaped conductive plates 60a,a' disposed on opposite sides of dielectric layer 52. Plates 60a,a' may be formed by copper metallization layers deposited on dielectric layer 52. Plates 60a,a' are electrically connected externally through conductive leads 62a,a', respectively. Similarly, capacitor 40b includes two planar, disk-shaped conductive plates 62b,b' disposed on opposite sides of dielectric layer 52. Plates 60b,b' may be formed by copper metallization layers deposited on dielectric layer 52. Plates 60b,b' are electrically connected externally through conductive leads 62b,b', respectively.

Dielectric layer 52 is preferably formed from a thermally-conductive material such as sapphire. In some embodiments, dielectric layer 52 may be formed from materials such as diamond, aluminum nitride, or thermally-conductive ceramics such as alumina (aluminum oxide) or beryllia (beryllium oxide). In some embodiments, dielectric layer 52 may be formed by a monolithic volume of a material such as single-crystal sapphire. In some embodiments, dielectric layer 52 may include multiple materials, for example multiple stacked layers of different materials. The thermal conductivity of dielectric layer 52 at the operating temperature of interest is preferably within an order of magnitude of the thermal conductivity of common metals such as copper. Commonly-used capacitor dielectrics typically have thermal conductivities several orders of magnitude lower than those of metals.

Capacitor plates 60, heat sink contact 54, and/or conductive leads 62a,a', 62b,b' may be formed from pure metals such as copper, gold, silver, or aluminum. The metal may be attached to dielectric layer 52 by direct bonding, plating and firing, sputtering, plating, or gluing a metal film, for example. Heat sink 58 may include a cold board, a solid heat sink block, a source of cryogenic fluid (e.g. a liquid helium or liquid nitrogen conduit), and/or any other structure/device capable of cryogenically cooling dielectric layer 52.

In some embodiments, the in-plane overall size (e.g. diameter for a circular shape) of each capacitor 40a-b may be between about 2 mm and 2 cm, while the thickness of each capacitor 40a-b may be between about 0.1 mm and 2 mm. In some embodiments, the capacitance of each capacitor 40a-b may have a value between 0.1 to 100 pF. The thermal conductivity of single crystal sapphire at 25K is ~6000 W/mK.

The achievable thermal conduction in the dielectric may be limited by geometry, surface finish and distance to the cold heat sink. Multiple skin-depths of conductor on the capacitor plates may be used to produce a high Q capacitor. Surface bonding of the conductor to the dielectric facilitates good heat transfer between the conductor and dielectric. Direct bonding of the metal to the dielectric is preferred, although thin layers of glue may provide acceptable results.

In some embodiments, to make a capacitor assembly as described above, a continuous plating of copper metal is deposited on a planar sapphire substrate to define capacitor plates on opposite sides of the substrate. One or more capacitors may be formed in one deposition step. One or more heat sink contacts may be defined by depositing copper on the sapphire substrate along the substrate edge. Conductive leads are attached to the capacitor plates, for example by soldering or resistive welding. Because the sapphire substrate is thermally conductive, the lead attachment process may be designed to ensure that attaching leads on one side of the substrate does not degrade a previous attachment of leads on the opposite side. In some embodiments, a resistive weld or high-temperature solder may be used to ensure that attaching leads on one side does not degrade (e.g. disconnect) the lead attachment on the other side. The assembly is then electrically connected to the NMR probe circuit, and thermally coupled to a cryogenic heat sink. In some embodiments, multiple capacitors may be constructed by depositing multiple copper dots on a sapphire wafer, dicing up the wafer, and electrically and thermally connecting each capacitor to external leads and a heat sink as described above.

FIG. 4-A shows a fixed capacitor assembly 150 including concave opposing plates 160,160' attached to opposite concave surfaces of a dielectric layer 152, according to some embodiments of the present invention. A capacitor geometry having a central waist and wider outer edge(s) as shown in FIG. 4-A permits a higher voltage to be held between the dielectric separated plates before coronal or arc discharge results.

FIG. 4-B shows a fixed capacitor assembly 250 including rounded-edge disk plates 260,260' attached to opposite flat surfaces of a planar dielectric layer 252, according to some embodiments of the present invention. The edges of conductive plates 260, 260' are rounded, increasing the withstanding voltage before field emission or coronal arcing occurs. The configuration of FIG. 4-B may allow a smaller improvement in the capacitor's voltage breakdown voltage than the configuration of FIG. 4-A, but may be easier to manufacture.

FIG. 5-A shows a capacitor assembly 350 including a single round capacitor 340, according to some embodiments of the present invention. A thermally-conductive dielectric support 352 extends between two opposing plates of capacitor 340. A heat sink thermal contact 354 is formed on dielectric support 352. Heat sink contact 354 is laterally (in-plane) spaced from capacitor 340.

FIG. 5-B shows a capacitor assembly 450 including a square capacitor 440, according to some embodiments of the present invention. A thermally-conductive dielectric support 452 extends between two opposing plates of capacitor 440. A heat sink thermal contact 454 is formed on dielectric support 452. Heat sink contact 454 is laterally (in-plane) spaced from capacitor 440. In some embodiments, a square capacitor such as capacitor 440 may be simpler to manufacture than a round capacitor such as capacitor 340. At the same time, sharp capacitor corners may reduce the maximum working voltage of the capacitor (the maximum voltage achievable before field emission or coronal arcing occurs).

The exemplary NMR circuit cooling systems and methods described above allow cooling NMR circuit components while minimizing the disturbance on circuit performance introduced by cooling components such as heat sinks. Conductors of RF circuits may heat up as RF current is run through the circuit. Such heating may be particularly noticeable in cryogenically-cooled NMR RF circuits. Thermally connecting a heat sink or other electrically conductive components directly to circuit conductors may add stray capacitance or otherwise interfere with the circuit ground. Sapphire is a particularly useful material for use as a dielectric in thermally-grounded capacitance assemblies as described above. Single crystal sapphire has good thermal conductivity at cryogenic temperatures, high dielectric constant, low dielectric loss, and allows achieving high circuit Q values.

The above embodiments may be altered in many ways without departing from the scope of the invention. Accordingly, the scope of the invention should be determined by the following claims and their legal equivalents.

What is claimed is:

1. A nuclear magnetic resonance probe comprising:
    a cryogenically-cooled radio-frequency nuclear magnetic resonance coil; and
    a cryogenically-cooled fixed capacitor electrically-connected to the radio-frequency coil, comprising
        a pair of fixed opposing electrically-conductive plates, and
        a thermally-conductive dielectric layer situated between the conductive plates and thermally coupled to a cryogenic heat sink through a contact area distinct from the conductive plates, for cooling the conductive plates through the dielectric layer.

2. The probe of claim 1, wherein the probe comprises a plurality of cryogenically-cooled fixed capacitors electrically connected to the radio-frequency coil, the plurality of capacitors comprising a corresponding plurality of pairs of opposing electrically-conductive plates disposed on opposite sides of the thermally conductive dielectric layer.

3. The probe of claim 1, wherein the conductive plates have a substantially-circular shape along a plane of the dielectric layer.

4. The probe of claim 1, wherein the dielectric layer and the conductive plates are generally planar.

5. The probe of claim 1, wherein the dielectric layer includes a pair of opposing concave surfaces, the pair of conductive plates being formed by generally concave conductive metal attached to the concave surfaces.

6. The probe of claim 1, wherein the dielectric layer is formed from sapphire.

7. The probe of claim 6, wherein the conductive plates are formed by layers of copper attached to the dielectric layer.

8. The probe of claim 1, wherein the dielectric layer comprises a material selected from a ceramic, diamond, and aluminum nitride.

9. The probe of claim 8, wherein the dielectric layer comprises a ceramic selected from alumina and beryllia.

10. The probe of claim 1, wherein an overall size of the capacitor in a major plane of the dielectric layer is larger than 2 mm and smaller than 2 cm.

11. A nuclear magnetic resonance apparatus comprising:
    a cryogenically-cooled thermal ground plane thermally-coupled to a cryogenic heat sink, the thermal ground plane forming a dielectric layer situated between opposing conductors of a fixed capacitor, wherein the thermal ground plane transfers heat from the conductors to the heat sink; and
    a cryogenically-cooled nuclear magnetic resonance radio-frequency coil electrically connected to the fixed capacitor.

12. A method comprising:
    cryogenically cooling a pair of opposing conductors of a fixed capacitor through a thermally-conductive capacitor dielectric disposed between the opposing conductors, the capacitor dielectric being connected to a cryogenic heat sink; and
    performing a nuclear magnetic resonance measurement using a cryogenically-cooled nuclear magnetic resonance radio-frequency coil electrically connected to the fixed capacitor.

13. The method of claim 12, comprising cooling a plurality of fixed capacitors through a cryogenically-cooled dielectric layer shared by the plurality of fixed capacitors.

14. The method of claim 12, wherein the dielectric is formed from sapphire.

15. The method of claim 12, wherein the dielectric comprises a material selected from a ceramic, diamond, and aluminum nitride.

16. The method of claim 15, wherein the dielectric comprises a ceramic selected from alumina and beryllia.

17. A low-temperature nuclear magnetic resonance apparatus comprising:

a cryogenically-cooled fixed lumped-element capacitor comprising:

a sapphire dielectric, a pair of metallic capacitor plates attached to opposite sides of the sapphire dielectric; and a metallic heat sink contact attached to the sapphire dielectric, for establishing a thermal connection between the capacitor plates and a cryogenic heat sink through the sapphire dielectric to cool the capacitor plates; and a nuclear magnetic resonance radio-frequency coil electrically connected to the capacitor.

\* \* \* \* \*